United States Patent [19]

Gokhale

[11] Patent Number: 5,195,496
[45] Date of Patent: Mar. 23, 1993

US005195496A

[54] IGNITION SYSTEM HAVING AN ELECTRONIC DISTRIBUTOR

[75] Inventor: Kalyan P. Gokhale, Shelby Township, Macomb County, Mich.

[73] Assignee: General Motors Corporation, Detroit, Mich.

[21] Appl. No.: 912,357

[22] Filed: Jul. 13, 1992

[51] Int. Cl.5 .............................................. F02P 7/02
[52] U.S. Cl. ........................... 123/643; 123/146.50 A; 307/311
[58] Field of Search ................. 123/146.5 A, 613, 643; 307/311

[56] References Cited

U.S. PATENT DOCUMENTS

| | | | |
|---|---|---|---|
| 2,941,119 | 6/1960 | Ford | 315/92 |
| 3,880,132 | 4/1975 | Whatley, Jr. | 123/599 |
| 4,881,512 | 11/1989 | Erskine et al. | 123/628 |
| 4,993,395 | 2/1991 | Vogel et al. | 123/643 |
| 5,002,034 | 3/1991 | Herden et al. | 123/643 |
| 5,109,829 | 5/1992 | Herden et al. | 123/643 |
| 5,125,387 | 6/1992 | De Wit et al. | 123/643 |

FOREIGN PATENT DOCUMENTS 1236561  6/1971  United Kingdom .

OTHER PUBLICATIONS

General Electric SCR Manual, 4th Edition (1967); pp. 107-122.
Motorola Optoelectronic Device Data (1981); pp. 4-39.

*Primary Examiner*—Tony M. Argenbright
*Attorney, Agent, or Firm*—Creighton R. Meland

[57] ABSTRACT

An ignition system for a spark ignited internal combustion engine has a plurality of high voltage switches connected respectively between a source of spark plug firing voltage and the spark plugs of the engine. Each high voltage switch includes a plurality of series connected light sensitive controlled rectifiers. The controlled rectifiers are associated with light emitting diodes which are positioned to apply light energy to the controlled rectifiers. When light energy is applied to a controlled rectifier, it is biased or gated conductive. The system is arranged such that all of the controlled rectifiers are biased conductive before the spark plug firing voltage is developed. A high voltage switch can be formed by mounting the controlled rectifiers on a substrate. The light emitting diodes are positioned such that the light emitted from one diode is applied to a plurality of controlled rectifiers.

10 Claims, 5 Drawing Sheets

IGNITION SYSTEM HAVING AN ELECTRONIC DISTRIBUTOR

This invention relates to an ignition system for a spark ignited internal combustion engine that utilizes high voltage switches comprised of series connected light sensitive semiconductors for connecting a source of spark plug firing voltage to the spark plugs of the engine.

Ignition systems that utilize a semiconductor to connect a source of spark plug firing voltage to the spark plugs of an internal combustion engine are known. Examples of such systems are disclosed in the U.S. Pat. Nos. to Whatley 3,880,132; to Erskine et al. 4,881,512; and to Herden et al. 5,002,034.

This invention utilizes a plurality of high voltage switches that connect a source of spark plug firing voltage to the spark plugs of an internal combustion engine. Each high voltage switch utilizes a plurality of series connected light sensitive controlled rectifiers that are gated conductive by applying light energy to the controlled rectifiers. The light energy that is applied to the controlled rectifiers is developed by light emitting diodes.

In the use of the system that has been described, it is possible that all of the controlled rectifiers may not turn-on at the same time. This can be due to, among other things, the fact that the turn-on characteristic of the controlled rectifiers are not the same. Thus, it is possible for some of the controlled rectifiers to turn-on before other controlled rectifiers turn-on. If this happens, the high spark plug voltage can be applied through the turned-on conducting controlled rectifiers to the anode-cathode circuit of a controlled rectifier that has not been turned-on with the result that the forward anode-cathode breakover voltage of the controlled rectifier that is not turned-on can be exceeded to cause that controlled rectifier to be damaged.

It accordingly is an object of this invention to provide an ignition system of the type described which is arranged to prevent a forward overvoltage from being applied to the controlled rectifiers of the high voltage switch. More specifically, the ignition system is arranged such that the high spark plug firing voltage is not developed until all of the controlled rectifiers have been gated conductive.

Another object of this invention is to provide a high voltage switch where the controlled rectifiers are mounted on a support or substrate. The controlled rectifiers are connected in series and are positioned on the support such that they are located in at least two parallel rows. The light emitting diodes are located relative to the controlled rectifiers such that the light that is emitted by one light emitting diode is applied to at least two controlled rectifiers that are located respectively in the rows.

Figure 1:
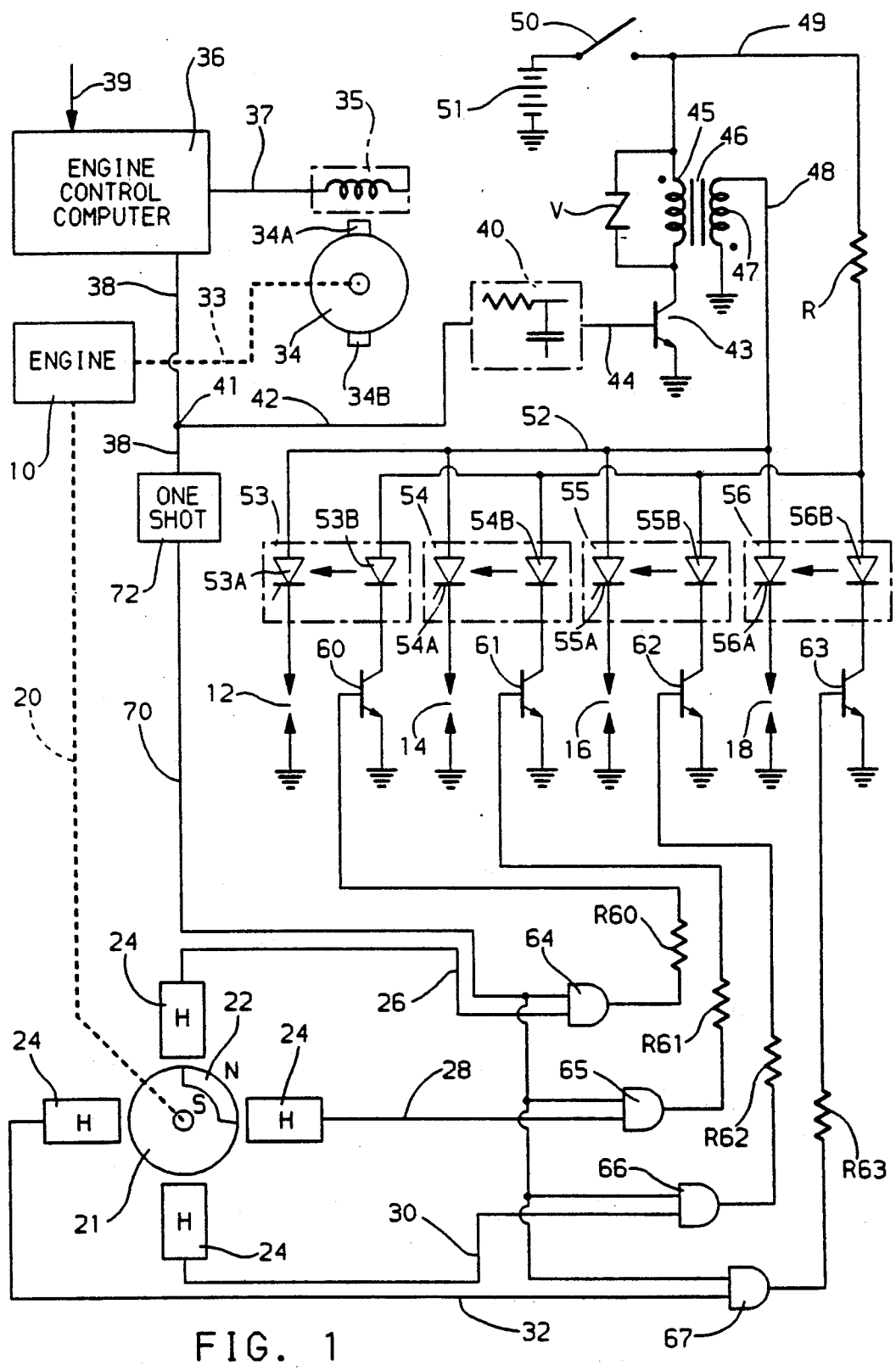
FIG. 1 is a circuit diagram of an ignition system that has an electronic distributor made in accordance with this invention.

Referring now to the drawings, and more particularly to FIG. 1, the reference numeral 10 designates a four-cycle spark ignited internal combustion engine that for purposes of explanation of this invention will be considered to be a four-cylinder engine. The four spark plugs for engine 10 are designated as 12, 14, 16 and 18. The camshaft 20 of engine 10 drives a disk or wheel 21 that carries a permanent magnet 22. The permanent magnet 21 extends arcuately for ninety degrees and this permanent magnet moves past four Hall effect sensors each designated as 24. The sensors are circumferentially spaced by ninety degrees and these sensors are respectively connected to lines 26, 28, 30 and 32. The arrangement is such that sequentially occurring square wave voltages are developed on lines 26-32 that respectively extend for ninety degrees of rotation of disk 21.

The crankshaft 33 of engine 10 drives another disk or wheel 34 having two teeth 34A and 34B that are spaced by 180 degrees. The teeth swing past a variable reluctance pick-up 35 that is connected to an engine control computer 36 by line 37. A pulse train is developed on line 37 that is comprised of a series of square wave pulses that are spaced by 180 crankshaft degrees. The pulses on line 37 are reference pulses for the computer 36.

The engine control computer 36 develops an output signal on line 38 which are a series of square waves. One of these square waves is shown in FIG. 3 and the square wave voltage on line 38 is identified as V38. The V38 wave voltage has a rising leading edge 38A and a falling trailing edge 38B. The engine control computer 36 computes the spark advance point at which the falling edge 38B occurs. Thus, computer 36 computes spark advance as a function of various engine operating parameters which are shown as an input 39. These inputs on line 39 can include, among other things, engine manifold pressure. Further, the engine computer 36 receives input information which represents engine speed which can be provided by the 180 degree pulses on line 37.

As is more fully described hereinafter, the primary winding of an ignition coil is energized for the pulse width of the square wave V38. This pulse width is sufficient for primary winding current to rise to the desired current level.

The computer 36 in response to the input engine operating parameter information calculates a spark timing value relative to the 180 degree reference pulses on line 37. The spark advance point where a spark plug is to be fired is where the falling edge 38B occurs. It will be appreciated that a series of square wave pulses like V38 are developed that are 180 crankshaft degrees apart and that the point that a falling edge 38B occurs will depend upon the spark advance value that is calculated by computer 36.

The line 38 is connected to one side of an RC delay network 40 via junction 41 and line 42. The opposite side of delay network 40 is shown connected to the base of an NPN switching transistor 43 by line 44. The emitter of transistor 43 is connected to ground and its collector is connected to one side of the primary winding 45 of an ignition coil 46. A varistor V is connected across primary winding 45. The secondary winding 47 of ignition coil 46 is connected between ground and a conductor 48. One side of primary winding 45 is connected to a line or conductor 49. Conductor 49 is connected to one side of an ignition switch 50. The opposite side of switch 50 is connected to the positive side of a twelve volt motor vehicle battery 51. The negative side of battery 51 is grounded.

The varistor V operates as a voltage clamp. In the event that a spark plug wire is accidentally removed, the effective gap "seen" by the ignition coil is very large. After the primary side switch 43 is turned off, the coil voltage goes on increasing and can cause an insulation breakdown in the coil and damage it. By providing the primary side voltage clamp at a level Vz, the secondary voltage can never exceed a value N multiplied by Vz, where N is the turns ratio of the ignition coil.

When transistor 43 is biased on or conducting, current flows through primary winding 45. When transistor 43 is biased off or nonconductive, a high spark plug firing voltage is induced in secondary winding 47 which is applied between ground and conductor 48. The primary and secondary windings of ignition coil 46 are wound such that the induced voltage in secondary 47 has a positive polarity at conductor 48 and a negative polarity at ground. The magnitude of the spark plug firing voltage developed by secondary winding 47 may be about 28,000 volts.

The transistor 43 can be a Darlington connected transistor. Further, the transistor 43 can be operated such that it is biased into a current limit mode. This can be accomplished by known current limit circuitry where a current sensing resistor is connected in series with the emitter of transistor 43 and where the voltage developed across this resistor can bias transistor 43 into a current limit mode when primary winding current reaches a predetermined current limit value.

The spark plug firing voltage on conductor or line 48 is applied to one side of four high voltage semiconductor switches by line or conductor 52. These switches are designated as 53, 54, 55 and 56 and are connected respectively between conductor 52 and respective spark plugs 12, 14, 16 and 18. Switch 53 (FIG. 1) is shown symbolically as being comprised of one photo sensitive silicon controlled rectifier 53A and one light emitting diode 53B. The anode of controlled rectifier 53A is connected to conductors 52 and 48 and its cathode is connected to spark plug 12. As will be more fully described hereinafter in connection with FIG. 2, the switch 33 has thirty-two series connected photo sensitive silicon controlled rectifiers that are all connected in series.

The light emitting diode 53B emits light in the infrared range, for example, a wavelength of about 950 nm. and this light is applied to controlled rectifier 53A. The controlled rectifier 53A responds to light energy of the 950 nm. wavelength. Only one diode, 53B, is shown for switch 53 but as will be more fully described hereinafter, eight series connected light emitting diodes are used in an arrangement where the light emitted by one diode is applied to four controlled rectifiers.

In the same fashion, switch 54 is comprised of thirty-two series connected photo sensitive controlled rectifiers 54A and eight series connected light emitting diodes 54B. Switches 55 and 56 likewise comprise the same number of series connected controlled rectifiers 55A and 56A and series connected light emitting diodes 55B and 56B.

Diodes 53B, 54B, 55B and 56B are connected respectively to the collectors of NPN switching transistors 60, 61, 62 and 63. The emitters of these transistors are connected to ground. The anodes of diodes 53B, 54B, 55B and 56B are all connected to power supply conductor 49 through a series current limiting resistor R. It can be appreciated that when, for example, transistor 60 is biased conductive, current is supplied to light emitting diode 53B which then emits light that is applied to photo sensitive controlled rectifier 53B causing controlled rectifier 53A to be optically gated or biased conductive between its anode and cathode. The same type of operation holds true when when transistors 61–63 are sequentially biased conductive.

The system of FIG. 1 has four AND gates designated respectively as 64, 65, 66 and 67. The output of AND gate 64 is connected to the base of transistor 60 through a base current limiting resistor R60. In the same fashion, the outputs of AND gates 65, 66 and 67 are connected respectively to the base of transistors 61, 62 and 63 through resistors R61, R62 and R63. When the output of an AND gate goes high, the transistor that it is connected to is biased conductive. For example, when the output of AND gate 64 goes high, the transistor 60 is biased conductive. With transistor 60, conducting light emitting diodes 53B are energized thereby biasing controlled rectifiers 53A conductive. When controlled rectifiers 53A conduct, they connect the high voltage on conductor 48 to spark plug 12 thereby causing spark plug 12 to fire.

The conductors 26, 28, 30 and 32 are connected respectively to one input of the AND gates 64–67. Since the permanent magnet 22 extends for ninety degrees and since the Hall effect sensors are spaced by ninety degrees, a square wave voltage is applied to one input of an AND gate for ninety degrees of rotation of the camshaft of the engine. As an example, when permanent magnet 22 passes by Hall effect sensor 24, one input to AND gate 64 will go high for a period of ninety degrees of rotation of the camshaft 20. It can be appreciated that as disk 21 rotates the AND gates have sequentially occurring ninety degree pulses applied thereto in a predetermined sequence. Thus, what has just been described provides a means for selecting, in sequence, the proper cylinders of the engine to be fired.

The other input to AND gates 64–67 is connected to a line or conductor 70. This conductor is connected to one side of a one-shot multivibrator 72. The opposite side of the one-shot 72 is connected to line 38.

Figure 3A:
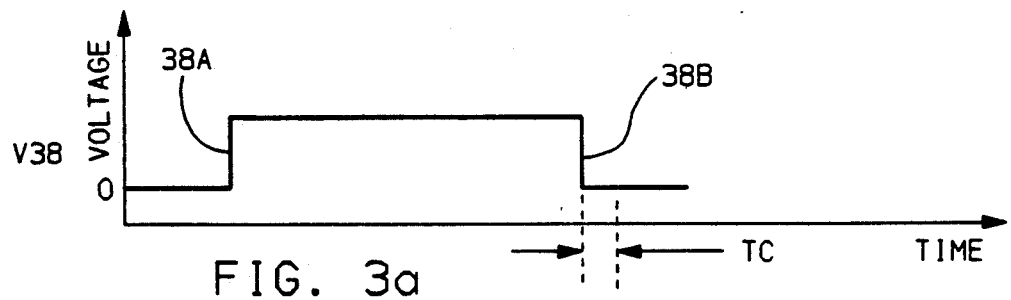
FIGS. 3a-3d illustrate waveforms that aid in understanding this invention.
Figure 3B:
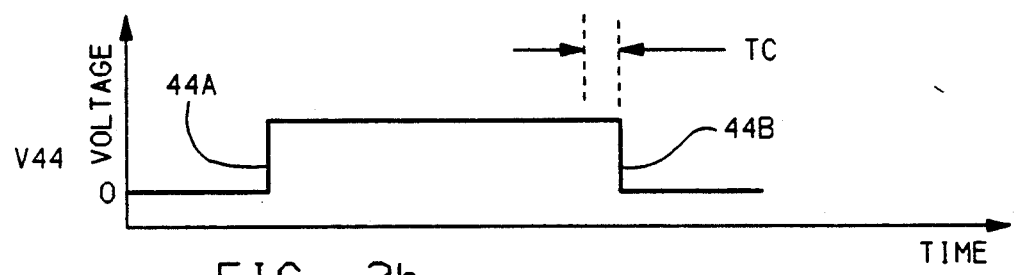
Figure 3C:
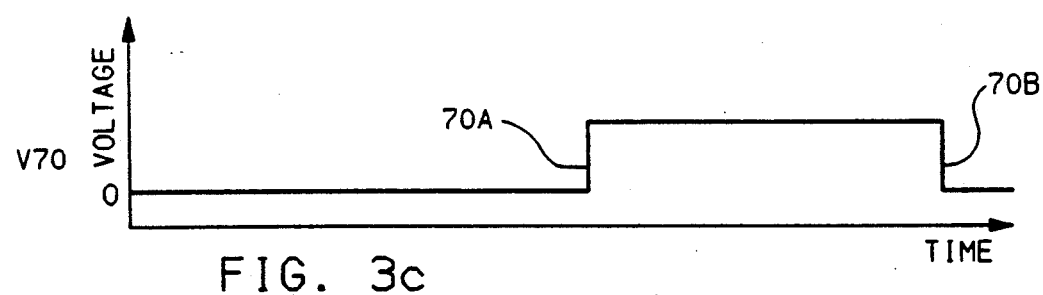
Figure 3D:
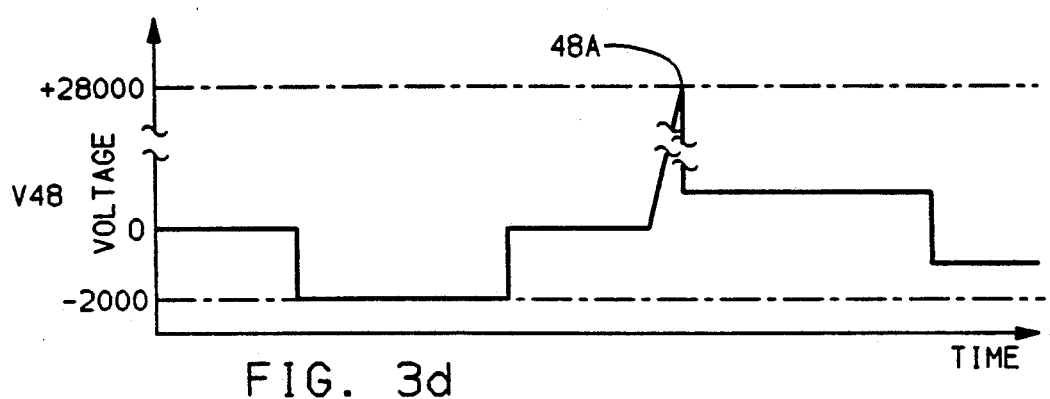

Referring now to FIGS. 3b, 3c and 3d, the voltage V44 on line 44, the voltage V70 on line 70 and the voltage V48 on line 48 are shown. Voltage V38 shown in FIG. 3a has been previously described. The voltage V44 is delayed by a time period TC from voltage V38 due to RC delay network 40. Thus, rising edge 44A is delayed from rising edge 38A and falling edge 44B is delayed from falling edge 38B by the time period TC. Putting it another way, edge 44A occurs after edge 38A and edge 44B occurs after edge 38B.

When the falling edge 38B occurs, the one-shot 72 is triggered which causes rising edge 70A of voltage waveform V70 to be developed. When the one-shot is triggered, it maintains the voltage on line 70 high until the one-shot times out, that is at a predetermined time period following rising edge 70A. When the one-shot does time out, the falling edge 70B is developed.

Voltage waveform V44 is applied to the base of switching transistor 43. Accordingly, when rising edge 44A occurs, transistor 43 is biased conductive and current is then supplied to primary winding 45. When falling edge 44B occurs, transistor 43 is biased nonconductive. A large spark plug firing voltage is now induced in secondary winding 47 which is applied to line 48. This is depicted as 48A in FIG. 3. This voltage, as previously described, may be about 28,000 volts.

The voltage V70 controls the time period that, for example, light emitting diodes 53B are energized which, in turn, causes controlled rectifiers 53A to be gated or biased conductive between anode and cathode. Controlled rectifiers 53A are gated or biased conductive when rising edge 70A occurs. They remain biased conductive until falling edge 70B occurs. It is important to note that rising edge 70A occurs before falling edge 44B. This means that controlled rectifiers 53A are all biased conductive before transistor 43 is biased nonconductive. This further means that all of the controlled rectifiers 53A have been biased conductive before the spark plug firing voltage is developed on line 48. The reason for this will be explained hereinafter.

Figure 2:
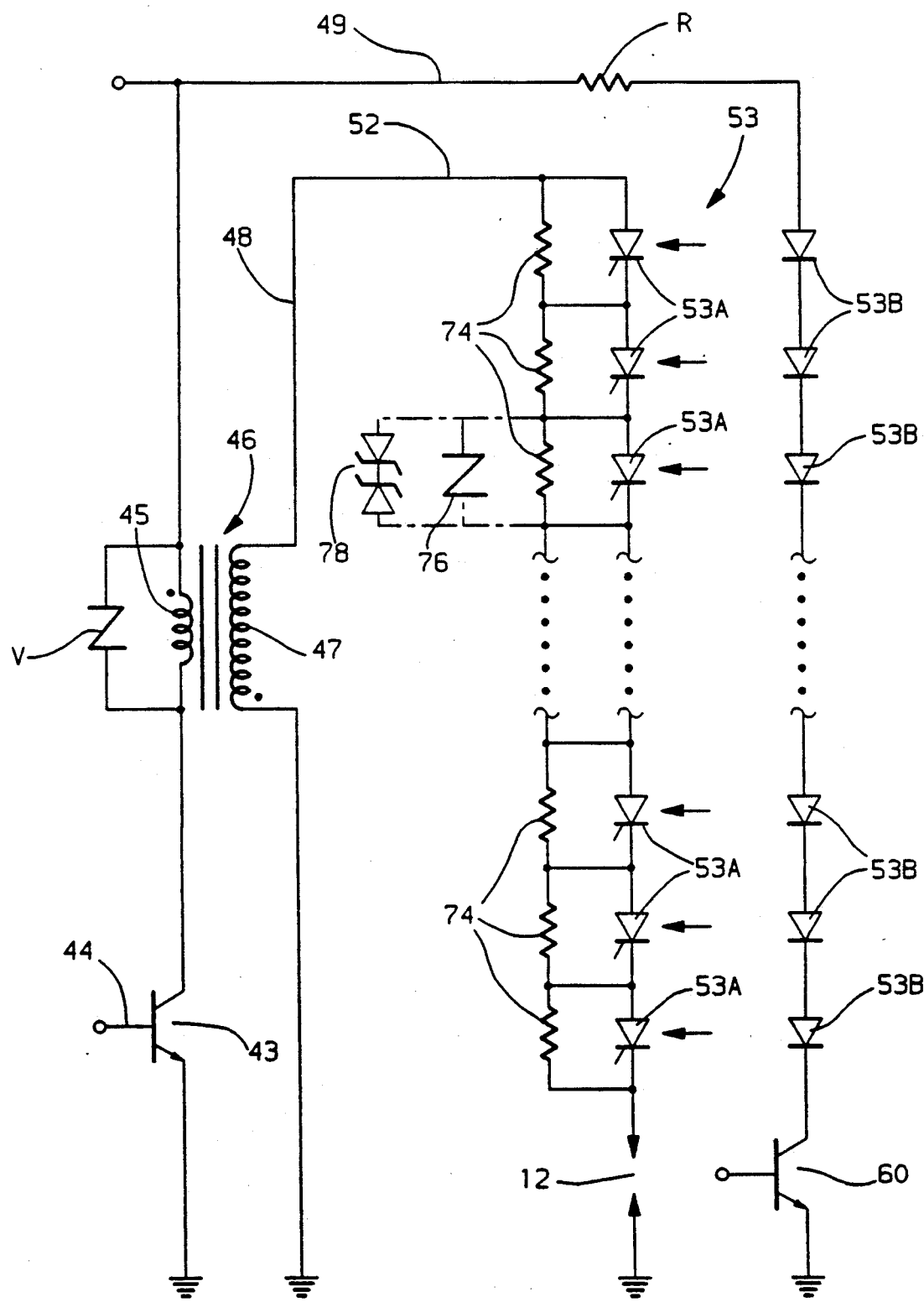
FIG. 2 illustrates in greater detail an electronic distributor shown in FIG. 1.

Referring now to FIG. 2, the manner of connecting the controlled rectifiers 53A in series is illustrated as well as certain parts of FIG. 1. In FIG. 2, the same reference numerals have been used as were used in FIG. 1 to identify corresponding elements in the two figures.

In FIG. 2, the high voltage switch 53 is shown as comprised of a plurality of series connected photo sensitive controlled rectifiers 53A. Only six controlled rectifiers are shown, but the dots in FIG. 2 are intended to denote additional series connected controlled rectifiers. It will be assumed that thirty-two series connected controlled rectifiers 53A are used. The controlled rectifiers each have a forward breakover voltage (anode to cathode) of about 1,000 volts when biased nonconductive. If this breakover voltage is exceeded, the controlled rectifier can be damaged. Assuming a forward breakdown or blocking voltage of 1,000 volts between anode and cathode of each controlled rectifier, the thirty-two series connected controlled rectifiers will be able to block or withstand a voltage of 32,000 volts when they are biased or gated nonconductive or, in other words, are in an off state.

Due to the unit-to-unit variation in the off state resistance and leakage currents of the controlled rectifiers, a voltage balancing network connected across the anode and cathode is necessary to avoid an excessive voltage across any one controlled rectifier of the string of controlled rectifiers. This network comprises thirty-two resistors each designated as 74. Each resistor is connected between the anode and cathode of a controlled rectifier. Further, the thirty-two resistors are all connected in series between conductor 52 and spark plug 12. Each resistor 74 may have a resistance of about 500K ohms.

The resistors 74 can each be replaced by a varistor 76 or back-to-back connected Zener diodes 78 as shown connected by dotted lines in FIG. 2.

In FIG. 2, switch 53 is shown as having six light emitting diodes 53B. Eight series connected light emitting diodes 53B are used and the dots are intended to indicate additional light emitting diodes. As will be described in connection with FIGS. 4 and 5, a single light emitting diode 53B is positioned such that the light it emits will strike or be applied to four controlled rectifiers 53A.

The voltage drop across the anode-cathode circuit of a conducting controlled rectifier, that is, a controlled rectifier that has been optically biased or gated on, is about one volt. Therefore, when using thirty-two series connected controlled rectifiers the total voltage drop across the series string will be about thirty-two volts.

As has been previously described, an important aspect of this invention is the fact that the series string of controlled rectifiers is optically gated or biased conductive before a spark plug firing voltage is developed on line 48. To explain this and with reference to FIG. 2, let it be assumed that the system was arranged such that a spark plug firing voltage had been developed on lines 48 and 52 prior to the time that the series string of controlled rectifiers 53A is optically biased or gated on. Assume now that the light emitting diodes 53B are energized. Since the turn-on times of controlled rectifiers 53A may be different from one controlled rectifier to another, let it be assumed that all of the upper thirty-one controlled rectifiers 53A turn-on before the turn of the controlled rectifier 53A that is connected to spark plug 12. If this happened, the voltage drop across the conducting controlled rectifiers would only be about 31 volts so that the voltage across the controlled rectifier 53A that is connected to spark plug 12 will be the voltage on conductors 48 and 52 less the voltage drop across the conducting controlled rectifiers of 31 volts. Therefore, if the spark plug firing voltage on conductors 48 and 52 exceeds about 1,031 volts the controlled rectifier connected to spark plug 12 will be damaged. If the voltage on conductors 48 and 52 were as high as 28,000 volts the controlled rectifier connected to spark plug 12 could be destroyed.

This invention solves the problem that has just been described by ensuring that all of the controlled rectifiers 53A are gated or biased on before the high spark plug voltage is developed on lines 48 and 52. This is achieved by causing falling edge 44B of waveform V44 to occur after the rising edge 70A of waveform V70. Thus, the light emitting diodes 53A are all energized when rising edge 70A occurs and light is now applied to controlled rectifiers. By the time falling edge 44B occurs, which is the point in time where the spark plug firing voltage is developed, all of the controlled rectifiers 53A have been biased conductive.

The time TC shown in FIGS. 3a and 3b may be about twenty-five microseconds, which should be more than the "turn on" time of a controlled rectifier. The time-out period of the one-shot 72 may be about two milliseconds which is approximately equal to the expected arc duration (or the secondary current decay time). Accordingly the time period between the edges 70A and 70B of the waveform 70 is two milliseconds. The controlled rectifier is a latching type device meaning once it is biased conductive, it does not need any more light energy to keep it conductive. In an engine the high speed air flow can temporarily extinguish the spark plug arc thus interrupting the secondary current for a short period. In such an event, the controlled rectifiers may prematurely turn off if the time-out period of the one-shot is smaller than the time at which the arc blow-out occurred.

Figure 4:
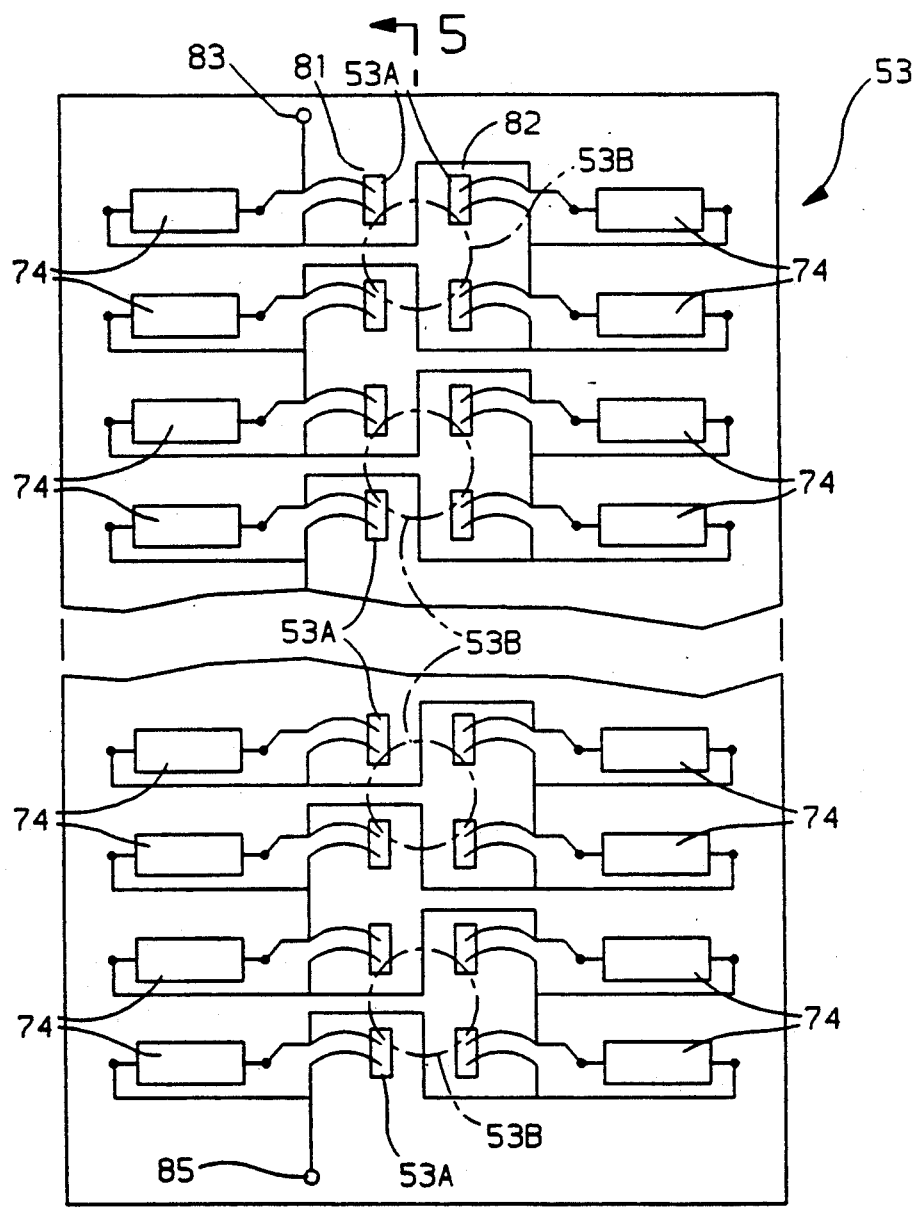
FIG. 4 is a top view of the physical construction of a high voltage switch made in accordance with this invention.
Figure 5:
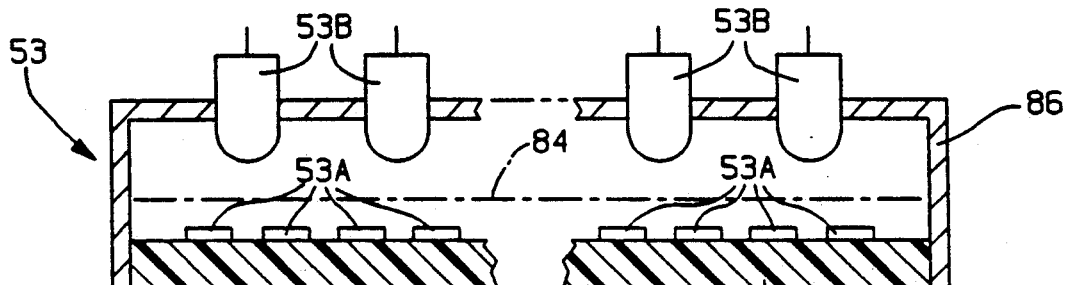
FIG. 5 is a sectional view taken along line 5—5 of FIG. 4.

Referring now to FIGS. 4 and 5, the physical construction of a high voltage switch made in accordance with this invention is illustrated. It will be assumed that the high voltage switch shown in FIGS. 4 and 5 is the switch 53 shown schematically in FIGS. 1 and 2.

In FIG. 4, which is a top view of a high voltage switch, the reference numeral 80 designates a support or substrate which is formed of any suitable electrical insulating material such as alumina or fiber glass. The controlled rectifiers 53A take the form of chips which are attached to an upper surface of substrate 80. The substrate 80 carries thirty-two controlled rectifiers 53A. Only sixteen controlled rectifiers are shown in FIG. 4, but it is to be understood that thirty-two controlled rectifiers are used. The controlled rectifiers are so positioned on substrate 80 that there are sixteen aligned controlled rectifiers in a first row designated as 81 and sixteen aligned controlled rectifiers in a second row designated as 82, which is parallel to row 81. Further, pairs of controlled rectifiers of each row are aligned. The controlled rectifiers are connected in series by copper traces on the substrate 80. Further, the substrate 80 carries 32 resistors each designated as 74. Two wirebonds, one each for anode and cathode, are used to connect the controlled rectifier to the copper traces on the substrate 80 which connect all the controlled rectifiers in series and one resistor 74 across each controlled rectifier 53A. The substrate 80, the copper traces, resistors and controlled rectifiers are potted in a transparent dielectric material like silicon gel up to a level designated by the line 84.

The switch 53 has an input junction or terminal 83 that is adapted to be connected to a source of spark plug firing voltage. In the systems of FIGS. 1 and 2, junction 83 would be connected to conductor 52. The switch 53 also has an output junction or terminal 85. Junction 85 is adapted to be connected to a spark plug and in the systems of FIGS. 1 and 2 would be connected to spark plug 12.

The switch 53 has eight light emitting diodes 53B only four of which are illustrated in FIGS. 4 and 5. These light emitting diodes are shown by dotted lines in FIG. 4. These dotted line representations of the light emitting diodes show their position relative to the positions of the controlled rectifiers. These diodes 53B are supported by a support 86 that is secured to substrate 80. The light emitting diodes are connected in series by conductors that have not been illustrated.

The light emitting diodes 53B are positioned in a row located between rows 81 and 82 and each diode is positioned such that the light it emits will impinge upon or strike four controlled rectifiers as is evident from FIG. 4. Further, the light emitting diodes each have a built-in lens to focus its radiation in a narrow cone so that all four controlled rectifiers receive adequate optical radiation.

The forward blocking voltage requirement of all the series connected semiconductor switches is a minimum of 28,000 volts, while the reverse blocking voltage requirement is only about 3,000 volts. Generally, the reverse and forward blocking voltage capability of a controlled rectifier device are identical, i.e., a 1,000 volt controlled rectifier will block 1,000 volts in both reverse and forward direction.

In the system of this invention, we do not need equal forward and reverse blocking voltage capability, one could use a controlled rectifier with unequal forward and reverse voltage blocking capability. Thus, for example, one could use a controlled rectifier with 1,000 volt forward blocking and 100 volt reverse blocking capability. Such an asymmetrical controlled rectifier with lower reverse blocking voltage capability is easier to fabricate and requires a smaller silicon chip area and therefore is less expensive.

Figure 6:
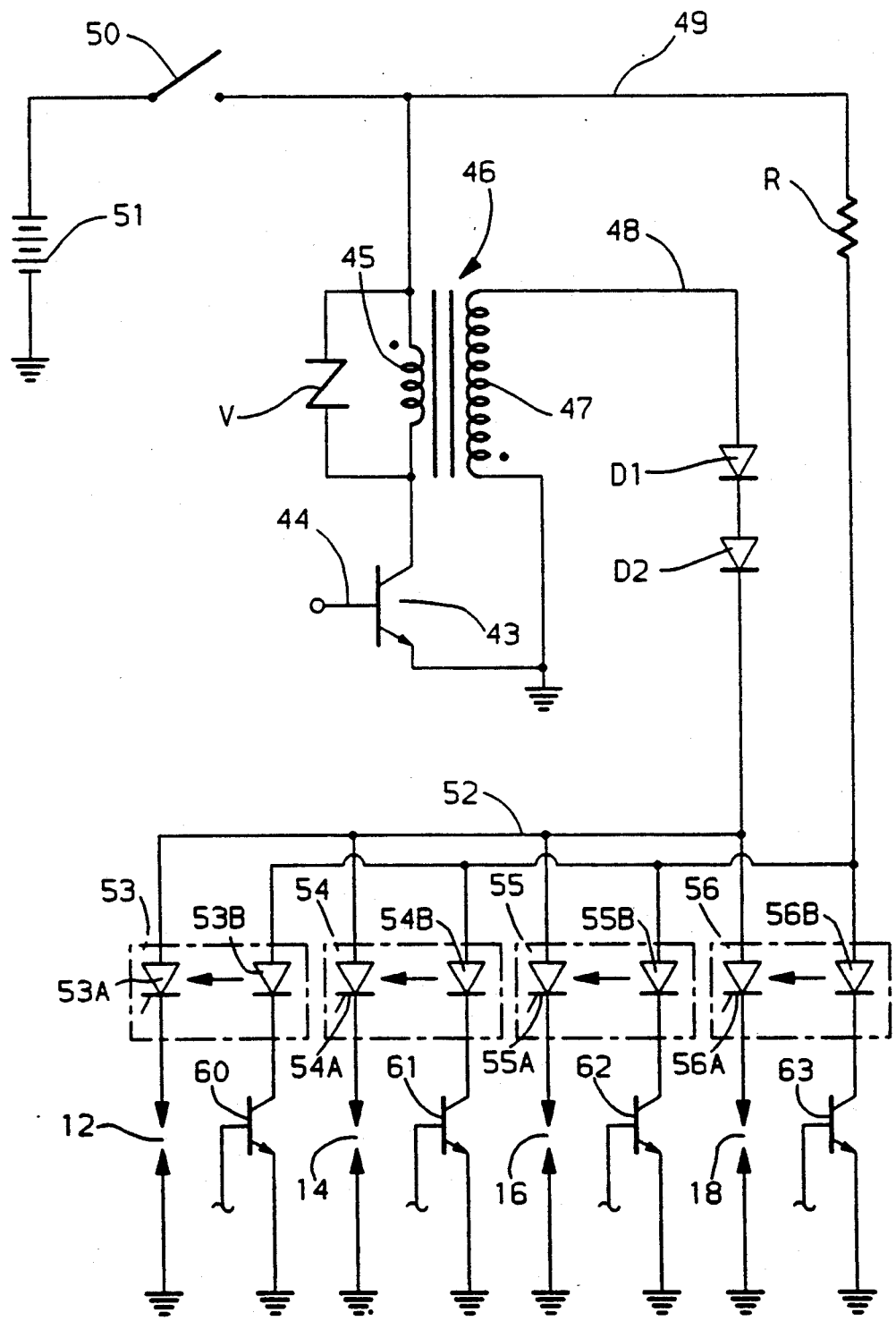
FIG. 6 is a circuit diagram of a modified ignition system made in accordance with this invention.

FIG. 6 illustrates a modified ignition system made in accordance with this invention. The same reference numerals have been used in FIG. 6 to identify corresponding circuit elements in the various figures.

In the system of FIG. 6, the reverse blocking voltage of controlled rectifiers 53A-56A can be reduced to nearly zero, for example, 20 volts. To accommodate such a low reverse blocking voltage, the system of FIG. 6 uses two blocking diodes D1 and D2. Each of these diodes has a reverse blocking voltage capability of 1,500 volts or a total reverse blocking capability of 3,000 volts. Alternatively, a single diode having a reverse blocking capability of 3,000 volts could be used. The diodes or diode block the reverse voltage developed in secondary winding 47.

The system of this invention has been disclosed as using an inductive system for developing the spark plug firing voltage. The system could use a capacitor discharge system for developing the spark plug voltage. Where a capacitor discharge ignition system is used, the controlled rectifiers would all be biased conductive before the spark plug firing voltage is developed in the same manner that has been described in connection with the inductive system.

The embodiments of the invention in which an exclusive property or privilege is claimed are defined as follows:

1. An ignition system for a spark ignited internal combustion engine comprising, means synchronized with operation of said engine for developing a spark plug firing voltage, means for applying said spark plug firing voltage to a conductor means, a spark plug, a high voltage switch connected between said conductor means and said spark plug, said high voltage switch being comprised of a plurality of light sensitive semiconductors that are connected in series, each light sensitive semiconductor being biased conductive when light energy is applied thereto, means operating in synchronism with said engine for periodically applying light energy to each said light sensitive semiconductors to thereby bias all of said semiconductors conductive and means for causing said semiconductors to be all biased conductive before said spark plug firing voltage is developed.

2. The ignition system according to claim 1 where said light sensitive semiconductors are light sensitive controlled rectifiers.

3. The ignition system according to claim 1 where the engine has a plurality of spark plugs and where said system include a plurality of high voltage switches equal in number to the number of spark plugs.

4. The ignition system according to claim 1 where said means for causing said semiconductors to be all biased conductive before a said spark plug firing voltage is developed comprises means for delaying the development of said spark plug firing voltage from the point in time at which light energy is applied to said semiconductors.

5. An ignition system for a spark ignited internal combustion engine comprising, means synchronized with operation of said engine for developing a spark plug firing voltage, means for applying said spark plug firing voltage to a conductor means, a spark plug, a high voltage switch connected between said conductor means and said spark plug, said high voltage switch being comprised of a plurality of light sensitive controlled rectifiers that are connected in series, each light sensitive controlled rectifier being gated conductive between anode and cathode when light energy is applied thereto, means operating in synchronism with said engine for periodically applying light energy to each said controlled rectifiers comprising a plurality of series connected light emitting diodes, and means for causing said controlled rectifiers to be all biased conductive before a said spark plug firing voltage is developed.

6. The ignition system according to claim 5 where said means for causing said controlled rectifiers to be all biased conductive before a said spark plug firing voltage is developed comprises means for energizing said light emitting diodes before said spark plug firing voltage is developed.

7. The ignition system according to claim 5 where said means for developing a spark plug firing voltage comprises an ignition coil having a primary winding and a secondary winding and wherein said primary winding is connected to a switching means that is operative to connect and disconnect said primary winding to and from a source of voltage.

8. The ignition system according to claim 5 where the engine has a plurality of spark plugs and where said system includes a plurality of high voltage switches equal in number to the number of spark plugs.

9. A high voltage switch that is adapted to be connected between a source of spark plug firing voltage and a spark plug comprising, a support, a plurality of light sensitive semiconductors carried by said support, said semiconductors all being connected in series between a first input terminal that is adapted to be connected to said source of spark plug firing voltage and a second terminal that is adapted to be connected to said spark plug, said semiconductors being positioned on said support in at least first and second rows, and a plurality of sources of light energy associated with said semiconductors for applying light energy selectively to said semiconductors, each said source of light energy being positioned so that the light it emits is applied to at least two of said semiconductors which are located respectively in said first and second rows.

10. The high voltage switch according to claim 9 where said light sensitive semiconductors are light sensitive controlled rectifiers and where said sources of light energy are light emitting diodes.

* * * * *